United States Patent [19]

Moraveji

[11] Patent Number: 5,515,007
[45] Date of Patent: May 7, 1996

[54] TRIPLE BUFFERED AMPLIFIER OUTPUT STAGE

[75] Inventor: Farhood Moraveji, San Jose, Calif.

[73] Assignee: National Semiconductor Corporation, Santa Clara, Calif.

[21] Appl. No.: 362,030

[22] Filed: Dec. 22, 1994

[51] Int. Cl.⁶ .................................... H03F 3/26
[52] U.S. Cl. ................................ 330/263; 330/267
[58] Field of Search ............................ 330/263, 266, 330/267, 268, 307

[56] References Cited

U.S. PATENT DOCUMENTS

| | | | |
|---|---|---|---|
| 3,815,037 | 6/1974 | Wheatley, Jr. | 330/257 |
| 4,791,383 | 12/1988 | Monticelli et al. | 330/265 |
| 4,827,223 | 5/1989 | Gross | 330/267 |
| 4,833,424 | 5/1989 | Wright | 330/267 |
| 4,894,622 | 1/1990 | Buitendijk | 330/307 X |
| 4,970,470 | 11/1990 | Gosser | 330/255 |
| 5,049,653 | 9/1991 | Smith et al. | 330/267 |
| 5,218,321 | 6/1993 | Jost | 330/267 |
| 5,323,122 | 6/1994 | Bowers | 330/267 |
| 5,339,042 | 8/1994 | Kaire et al. | 330/261 |

FOREIGN PATENT DOCUMENTS

| | | | |
|---|---|---|---|
| 1160530 | 6/1985 | U.S.S.R. | 330/255 |
| 1192111 | 11/1985 | U.S.S.R. | 330/263 |
| 1254579A | 8/1986 | U.S.S.R. | 330/267 |

*Primary Examiner*—Steven Mottola
*Attorney, Agent, or Firm*—Skjerven, Morrill, MacPherson, Franklin & Friel; Norman R. Klivans; Arthur J. Behiel

[57] ABSTRACT

In a triple buffer stage output stage applicable to an operational amplifier, the two transistors in the first buffer stage are bootstrapped to the second buffer stage. The collector voltage of each transistor in the first buffer stage thereby follows the input signal at the high impedance node and therefore their parasitic capacitance to the substrate does not have a significant effect. This bootstrapping the collectors of the transistors of the first buffer stage minimizes parasitic capacitance effects and improves phase delay of the output stage. Additionally, the PNP transistors in the signal path of the output stage are fabricated in isolated N-wells to minimize the effect of the N-well to collector capacitance, the N-wells of the signal path PNP transistors which are reverse biased also being bootstrapped. Also provided in the output stage are an RC network connected between the input node of the output stage and its output terminal, and damping resistors to dampen peaking at higher frequencies and minimize temperature effects on amplifier performance. In a second embodiment, the two transistors in the first buffer stage each has multiple additional emitters, each connected to the output terminal. This bootstraps the output stage at lower frequencies, improving performance.

25 Claims, 7 Drawing Sheets

TRIPLE BUFFERED AMPLIFIER OUTPUT STAGE

BACKGROUND OF THE INVENTION

1. Field of the Invention

This invention relates to amplifiers and more specifically to an improved amplifier output stage.

2. Description of the Prior Art

FIG. 1(a) shows a prior art double buffered (two emitter follower) output stage for an amplifier such as an operational amplifier. The input node (terminal) receives a signal from the input stage of the amplifier (not shown). The first buffer stage includes transistors Q1 and Q3 which drive the second buffer stage transistors Q2 and Q4. Transistors Q5 and Q6 are short circuit protection. Constant current sources I1 and I2 set the quiescent current of this output stage. The voltage supplies are the positive supply voltage $V_{cc}$ and a negative supply voltage $V_{ee}$.

The collector terminals of transistors Q1 and Q3 are respectively connected to voltage references $V_{ee}$ and $V_{cc}$. Other elements of this output stage, including the feedback portion, are conventional but not shown.

This amplifier (in its integrated circuit version) has a disadvantage caused by the parasitic capacitances associated with each of transistors Q1 and Q3 and especially the parasitic capacitance associated with base to collector region capacitance $C_{jc}$. There is also the inherent parasitic capacitance of each current source I1 and I2 which adds to the capacitive load at the base terminals of the second buffer stage transistors Q2 and Q4. These capacitances undesirably reduce amplifier performance (response to an input signal) by slowing the switching speed of the transistors, hence undesirably increasing amplifier phase delay and reducing slew rate.

A second prior art amplifier output stage shown in FIG. 1(b) includes three buffer stages. The first buffer stage includes transistors Q1 and Q2; the second buffer stage includes transistors Q3 and Q4; the third buffer stage includes transistors Q5 and Q8. This output stage has the same deficiencies as those described above for that of FIG. 1(a), however, it has more current drive capability.

FIG. 2 shows a third prior art amplifier output stage. As in the previous stages, the signal at node $V_{IN}$ (equivalent to the input terminal of FIGS. 1(a), 1(b)) is provided from an amplifier input stage (not shown). The amplifier output stage of FIG. 2 has several of the deficiencies described above. First, parasitic capacitance $C_{jc}$ is present between the base and collector terminals of each of transistors Q3 and Q4 which are the first buffer stage. Similarly, there is a parasitic capacitance $C_{jc}$ between the base and collector terminals of each of transistors Q5 and Q8 which are the second buffer stage, and a parasitic capacitance $C_{je}$ between the base and emitter of each of transistors Q5 and Q8. Additionally, there are parasitic capacitances at nodes A and B which are indicated as capacitances $C_p$.

Also, the capacitor $C_c$ and resistor $R_c$ are connected in series between the input terminal $V_{IN}$ and the output terminal $V_{OUT}$. The purpose of capacitor $C_c$ is to bypass the output stage at higher frequency and improve stability. For a typical amplifier the capacitance $C_c$ is typically a large value, i.e. 10 picofarad or greater. In an integrated circuit this requires an excessive amount of chip surface area (real estate) in a typical MOS process to fabricate such a large value capacitor, thus undesirably increasing the cost of the integrated circuit.

This output stage needs high quiescent current for a large slew rate due to the large parasitic capacitances as described above. This amplifier also exhibits the problem of slow response to high slew (large signal transition) conditions.

There is therefore a need to minimize parasitic capacitance effects in amplifier output stages and reduce the phase delay and improve slew response of the amplifier output stage in order to improve amplifier performance, especially in multi-buffer output stages and during large signal transitions.

SUMMARY OF THE INVENTION

1. First Embodiment—Bootstrapped Collectors

In accordance with a first embodiment of the invention, an integrated circuit amplifier output stage includes at least two buffer stages, each buffer (or emitter follower) stage conventionally including at least two transistors of opposite polarity types. The voltage at the collectors ("second current handling terminal") of the two transistors, which are the first emitter follower stage, follows the voltage of the signal at the high impedance (input) node of the output stage, and therefore the parasitic capacitance of the collector region to the base ($C_{jc}$) in which these transistors are formed does not have a significant effect. Thus the parasitic capacitance of each of these transistors is effectively eliminated by "bootstrapping". In other words, the collector-base of these transistors sees the same amount of AC signal, and since $i=CdV/dt$, this minimizes current drawn by these parasitic capacitances. The bootstrapping thereby reduces the effect of the parasitic capacitance significantly.

There are in one version three emitter followers (i.e., buffer stages) in the amplifier output stage, the third of which includes n interdigitated (where $n \geq 2$) pairs of transistors, to prevent current crowding at each emitter ("first current handling terminal") during high current drive. Additionally, an RC network is connected between the input node and output terminal of the output stage. This RC network is also bootstrapped and therefore provides stability when there is a capacitive load on the amplifier.

Additionally, damping resistors are connected to the emitters of the transistors in the buffer stages to dampen the undesirable emitter follower peaking at higher frequencies. These resistors also improve the gain margin at the expense of a small amount of bandwidth. These resistors also minimize the effects of temperature on overall amplifier performance.

The PNP transistors in each of the three buffer stages may be formed in isolated N-wells. In order to minimize the effect of collector to N-well parasitic capacitance, the N-well of each of these PNP signal path transistors that is reverse biased is bootstrapped to a collector of the same transistor, i.e. the collector to N-well diode is DC-wise reverse biased, however AC-wise they have the same signal.

2. Second Embodiment—Extra Emitters

In a second embodiment of the invention, an amplifier output stage includes at least two emitter followers (buffer stages), and each emitter follower includes two transistors of opposite polarity type. A circuit similar to that described above bootstraps the collector of each of the two transistors in the first emitter follower to the emitter of a transistor of the same polarity type in the second emitter follower. The collectors of these two transistors follow the input signal through the emitters of the two transistors in the subsequent follower stage, so the capacitance $C_{jc}$ is bootstrapped. In addition, the two transistors in the first emitter follower each have at least one additional emitter with large area. These additional emitters of the two transistors are connected together and also connected (via a resistor) to the output terminal of the output stage. The resulting large base-emitter capacitances of the two transistors in the first emitter follower are a form of an RC network that is bootstrapped at low frequency; however, at higher frequencies the network is partially bootstrapped and adds a capacitance at the high-impedance point. This is especially advantageous if the output stage is used in an operational amplifier. These additional emitters may be a plurality of extra emitters for each transistor, collectively having an area e.g. ten times that of the other emitter, thus providing the high needed capacitance. This capacitance substitutes for the conventional capacitor $C_c$ in the prior art amplifier of FIG. 2. These extra emitters that form the capacitance are in series with a resistor and share the same base area with the smaller emitter through which the signal is passed to the output.

At internal nodes A and B of the present output stage (see FIG. 2 for location of these nodes in a prior art amplifier), there are parasitic capacitance present which are referred to here as respectively $C_{S1}$ and $C_{S2}$. These capacitances are relatively large. During the sharp transients, the slew rate at nodes A and B is limited to respectively $I_1/C_{S1}$ and $I_2/C_{S2}$. In order to improve the slew rate, either the DC value of the current source must be increased or the capacitances made smaller. The capacitances are subject to layout and transistor sizes and cannot be readily changed. If the DC value of current sources I1 and I2 is increased, then the quiescent current of the whole chip will be increased—which is not desirable. Thus in accordance with the present invention, current boost transistors which are normally off are provided. However, during sharp transients, these transistors turn on and momentarily provide extra current to the nodes A and B and improve the slew rate by charging the parasitic capacitances present at nodes A and B faster.

Each of these current boost transistors, one associated with each of the upper and lower portions of the output stage, has its control terminal (base) connected to the input terminal of the output stage and its emitter (first current handling terminal) connected to the control terminal of an associated transistor in the second buffer stage. The additional current supplied by these current boost transistors thus helps overcome the parasitic capacitances associated with the second buffer stage.

While the presently disclosed embodiments are directed to amplifiers using bipolar transistors, the invention is also applicable with suitable modifications (apparent to one ordinarily skilled in the art) to FET amplifiers and to discrete component (non-integrated circuit) amplifiers.

BRIEF DESCRIPTION OF THE DRAWINGS

Similar reference numbers in various figures do not refer to the same structures unless it is specifically so indicated.

DETAILED DESCRIPTION OF THE INVENTION

1. First Embodiment—Bootstrapped collectors

Figure 3:
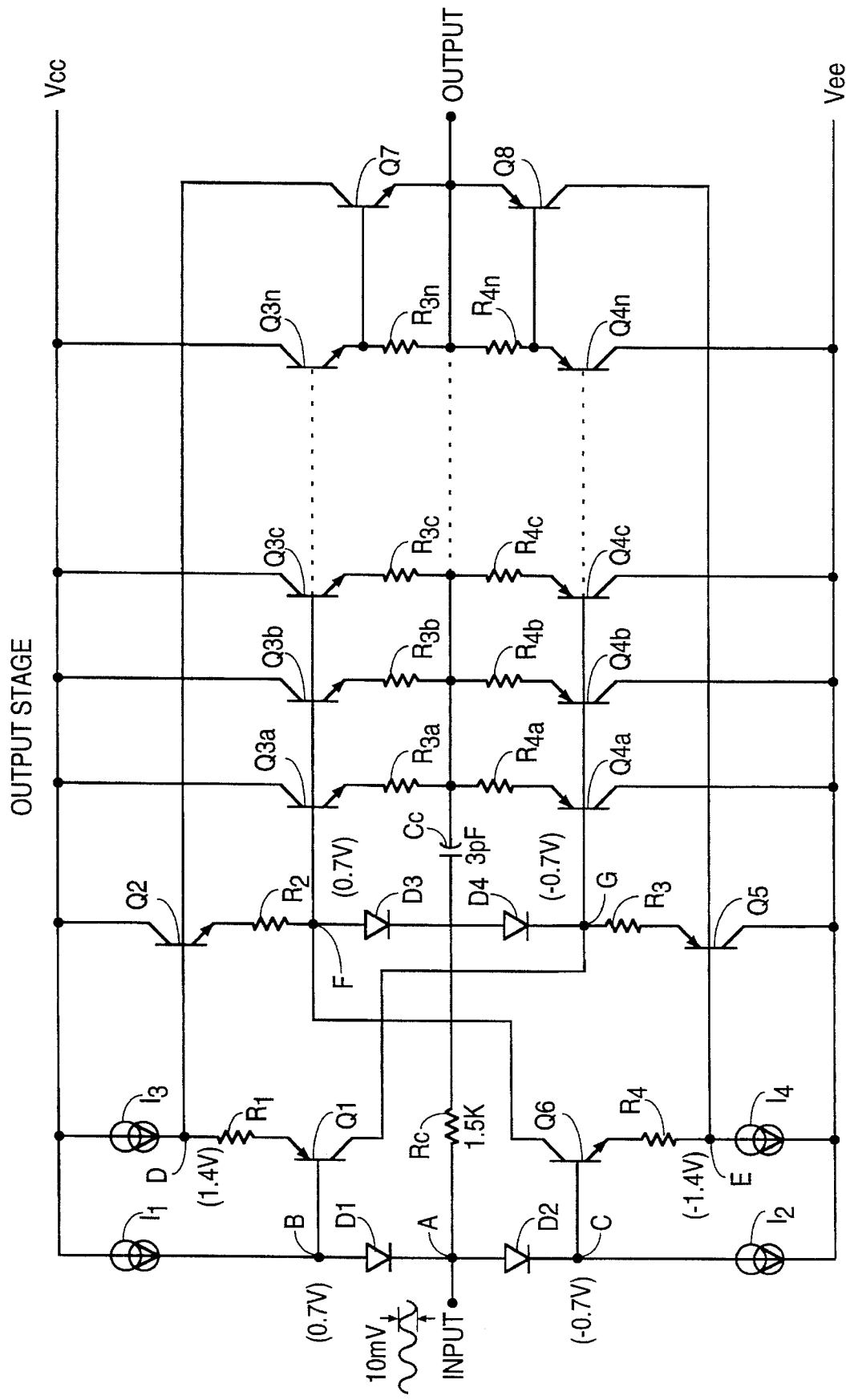
FIG. 3 shows a schematic of an amplifier output stage in accordance with a first embodiment of the present invention.

FIG. 3 shows a schematic of an amplifier triple buffered output stage in accordance with the present invention. The output stage of FIG. 3 is intended to be a portion of a low power, high speed voltage feedback amplifier. The three emitter followers (buffer stages) in the output stage each conventionally include at least one transistor pair which includes a push (top side) and a pull (bottom side) transistor. The first buffer stage includes transistors Q1 and Q6; the second buffer stage includes transistors Q2 and Q5; the third buffer stage includes interdigitated transistor pairs Q3a, ..., Q3n and Q4a, ..., Q4n. conventional constant current source I3 biases the top side and conventional constant current source I4 biases the bottom side.

The collectors of transistors Q1 and Q6, which form the first buffer stage, are bootstrapped to the input signal through the emitter of transistor Q2 and resistor R2 in the top side and the emitter of transistor Q5 and resistor R3 in the bottom side.

An analysis of appropriate nodes of this circuit provides an understanding of its operation as described hereinafter. Assume that the input node A is at 0 volts DC and has a 10 mV AC signal applied from the amplifier input stage.

Then assuming a typical voltage drop across each of diodes D1 and D2 of 0.7 volts, nodes B and C (the bases of respectively transistors Q1 and Q6) are respectively at 0.7 V+10 mv AC and −0.7 V+10 mV AC. (It is to be understood in this case that the 10 mV AC is only an exemplary amplitude of the input signal A.) Thus by conventional circuit analysis it can be seen that node D, which is connected to the emitter of transistor Q1, is at a voltage of +1.4 V+10 mV AC and node E (connected to the emitter of corresponding lower side transistor Q6) is at a voltage of −1.4 V+10 mV AC. (The base-emitter potential drop $V_{BE}$ across each transistor is also assumed to be 0.7 V.) It is to be understood that the damping resistors, e.g. R1, R4, R2, R3, in the output stage are low value resistors and hence the potential drop across these resistors is not considered in this circuit analysis. Then taking into account the $V_{BE}$ potential drop across transistors Q2 and Q5 in the second buffer stage, nodes F and G (respectively connected to the collectors of transistors Q6 and Q1) are at voltages of respectively 0.7 V+10 mv AC and −0.7 V+10 mV AC.

As can be seen from this analysis, the collector-base of transistors Q1 and Q6 is reversed biased by a diode drop. However, AC-wise the collector-base of each transistor has the same amount of AC signal. This in effect bootstraps the $C_{jc}$ capacitance of each transistor and improves AC performance of the output stage.

Transistors Q7 and Q8 are short circuit protection transistors. If the output current exceeds a certain level set by resistors R3n and R4n, then transistors Q7, Q8 turn on, stealing the base current to transistors Q2 and Q5 respectively.

Resistors R1, R2, R3, R4 and R3a, ..., R3n and R4a, ..., R4n prevent follower peaking and improve the output stage AC and transient response. These resistors also provide some temperature compensation in minimizing the effect of temperature upon overall performance of the amplifier. The damping resistors also improve the gain margin, at the expense of a small decrease in bandwidth.

The present triple buffered output stage provides, in the embodiment of FIG. 3, 100 mA of current into a load at the "output" terminal. The series connected $R_c$-$C_c$ (resistor-capacitor) network connected across the output stage between the input node and the output terminal is "bootstrapped" and hence does not have a significant effect at lower frequencies (i.e., is like an open circuit at lower frequencies). When driving a capacitive load, however, this $R_c$-$C_c$ network is only partially bootstrapped, advantageously adding to the compensation capacitance of the amplifier at the input node and thus improving stability of the amplifier performance. (The overall amplifier is not shown here.)

Further in accordance with the present invention, the transistors of the amplifier of FIG. 3 are in one embodiment fabricated to result in a particular structure. (It is to be understood that other transistor structures are also compatible with the present invention.) The active regions of the PNP transistors are fabricated inside an isolated N-well tub. In order to minimize the effect of collector-N-well to collector capacitance, the N-wells of the signal path PNP transistors are DC-wise reverse biased. However, AC-wise the transistor N-well follows the collector signal. Therefore capacitance $C_{js}$ is bootstrapped. Transistors that form the current mirrors I1 and I3 use this structure.

Figure 4A:
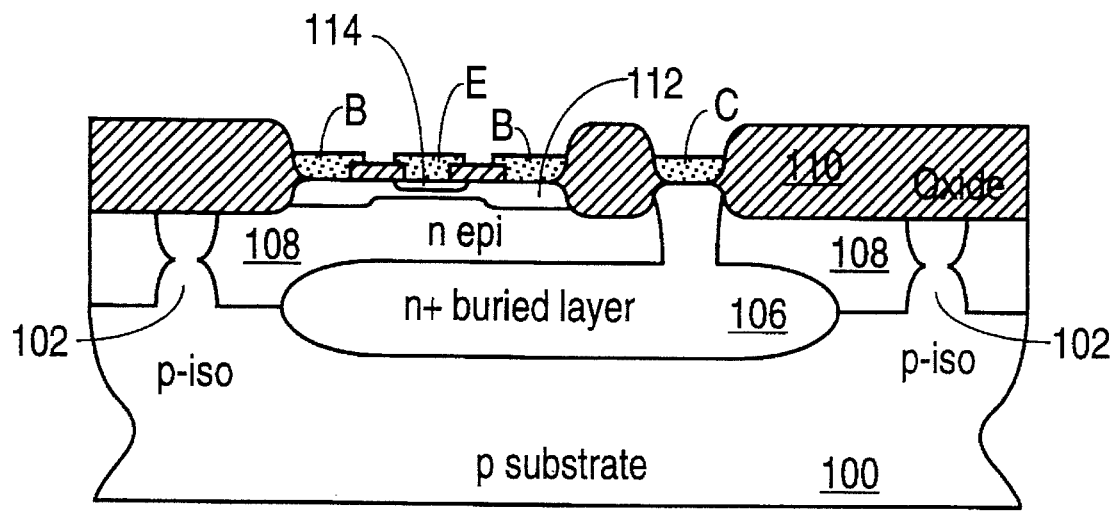
FIG. 4(a) shows a cross sectional view of an NPN transistor used in the first embodiment.

FIG. 4(a) shows in cross-section an NPN transistor as used in the amplifier of FIG. 3, e.g. transistors Q6, Q2, and Q3a, ..., Q3n. The P doped substrate 100 has formed in it N+ doped buried layer 106, located partially in N doped epitaxial layer 108 and partially in the P doped substrate 100. For each transistor there is a P doped isolation region 102 having both an upper and lower portion. Field oxide 110 is formed on the principal surface of epitaxial layer 108. A P doped region 112 is the base region. N doped region 114 is the emitter region. The emitter, base and collector region conventionally are doped polysilicon contacts and designated by their respective letters E, B, and C.

Figure 4B:
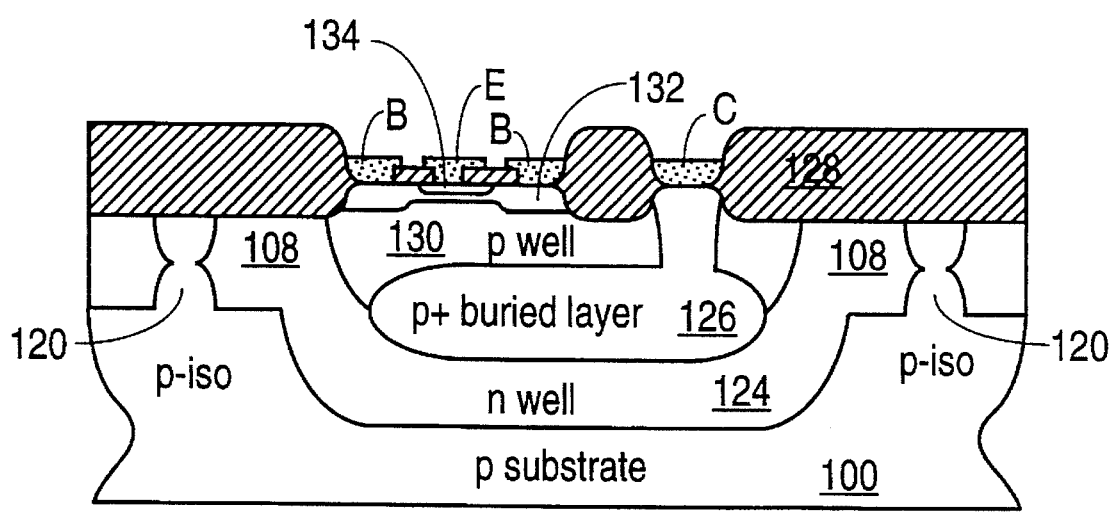
FIG. 4(b) shows a cross sectional view of a PNP transistor used in the first embodiment.

A corresponding PNP transistor (e.g. transistors Q1, Q5, and Q4a, ..., Q4n and transistors in I1 and I3 of FIG. 3) having the isolated N-well is shown in FIG. 4(b) and also is formed in P doped substrate 100, and has P doped isolation regions 120 including an upper and lower portion surrounding the N doped well 124. A P+ doped buried layer 126 is formed in N doped well 124. Formed on the principal surface of the N doped epitaxial layer 108 is field oxide 128. Also formed in epitaxial layer 108 is a P doped well 130. Formed in P doped well 130 is an N doped base region 132 in which is formed a P doped emitter region 134. The emitter, base and collector region contacts are again doped polysilicon formed on the principal surface of the epitaxial layer 108 and are designated by their respective letters E, B and C.

Fabrication of the transistors of FIGS. 4(a) and 4(b) is conventional using a complementary poly-emitter bipolar process.

The N-well bootstrapping here (which is independent and distinct from the bootstrapping of the transistor Q1 and Q6 collectors as described above) minimizes N-well 124 to collector region 126 capacitance (conventionally designated $C_{js}$). As is well known (see FIG. 5) there is a parasitic diode $D_p$ (a PN junction) and an associated parasitic capacitance $C_{js}$ between the P+ doped collector region 126 and the N well 124. (In a conventional amplifier, the N well 124 is connected to the positive voltage supply $V_{cc}$, not shown.)

Figure 5:
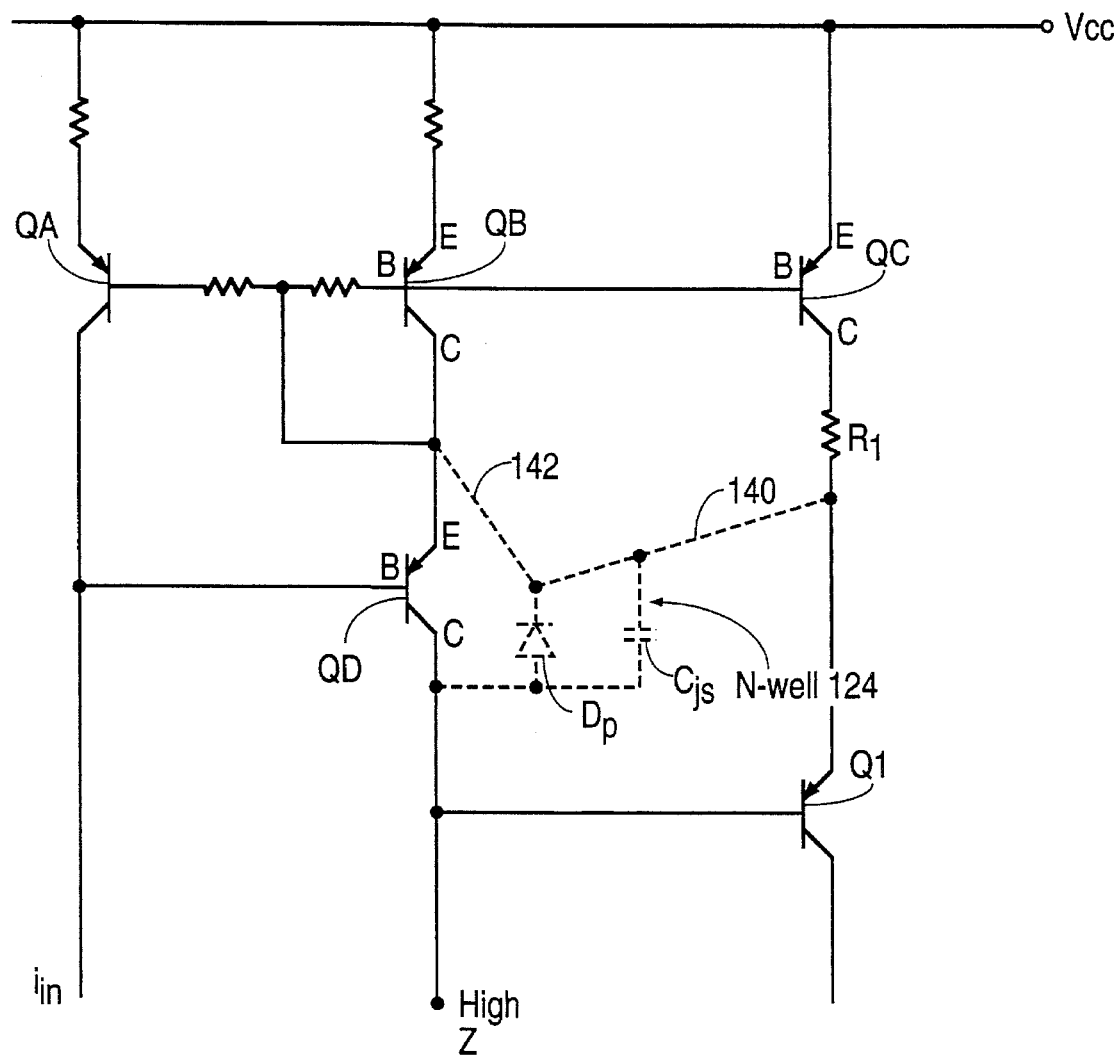
FIG. 5 shows bootstrapping of a signal path PNP transistor N-well in the first embodiment.

However, in accordance with the present invention and as shown schematically in FIG. 5, the N well 124 of signal path transistor $Q_D$ (which is also the cathode of the parasitic diode $D_p$) is instead connected by conductor 142 to the collector of another signal path PNP transistor $Q_B$. (The signal path transistors shown here include those in the current sources I1 and I3 of FIG. 3, detail of which is not shown in FIG. 3.) Connection 142 also thereby connects one side of the associated parasitic capacitance $C_{js}$ similarly to the collector of the other signal path PNP transistor $Q_B$. (This additional connection 142 is not shown in the schematic of FIG. 3 since the N wells of the various PNP transistors are conventionally not shown in the schematic.) This connection 142 is accomplished by a conventional metallized interconnect of the type typically used in integrated circuits. Parasitic diode $D_p$ should be reverse biased, DC-wise.

An alternate connection 140, also providing the bootstrapping for the N well 124, is shown by the second dotted line 140 in FIG. 5 wherein the N well 124 of transistor $Q_D$ is connected, i.e. bootstrapped, to the collector of transistor $Q_C$ through resistor R1. (Connections 140 and 142 are alternatives; only one is used.) This bootstrapping of the N wells is only done for transistors where their capacitance $C_{js}$ is on the signal path.

Also in accordance with the invention, a number of the PNP transistors are formed in a (single) shared N well. This advantageously provides die size reduction. For instance, transistors Q1, Q4, Q5, etc. of FIG. 3 may all be formed in a single N well. The single N well may be in one version one large N well, with each transistor (as in FIG. 4(b)) having its own P well and P+ buried layer. Alternatively, the shared N well defines a separate well for each transistor with N doped "sinker regions" extending from the principal surface of the substrate between each transistor down to the N wells, thus shorting together the various N wells and forming in effect a shared N well.

2. Second Embodiment—Extra Emitters

Figure 2:
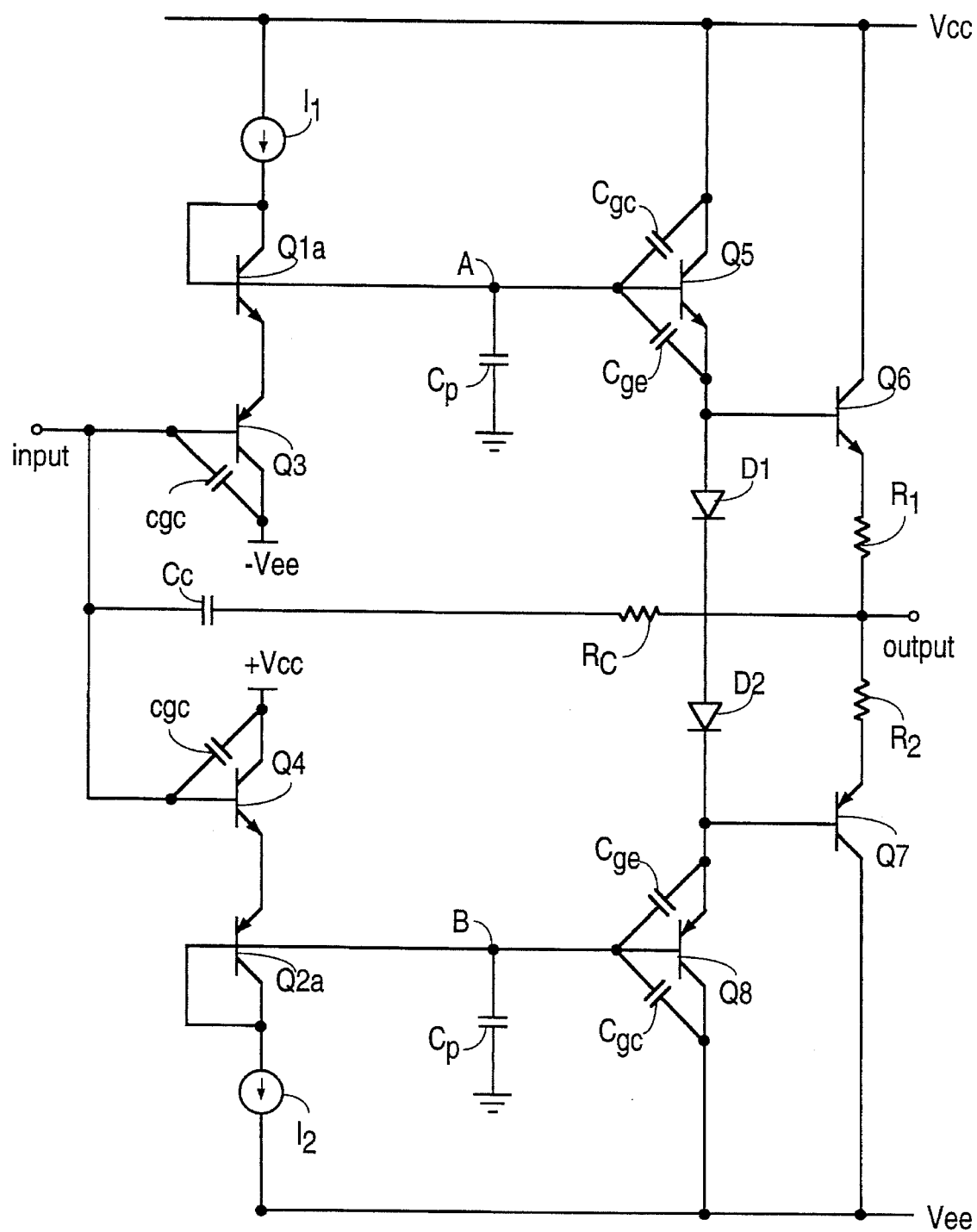
FIG. 2 shows a third prior art amplifier output stage.
Figure 6:
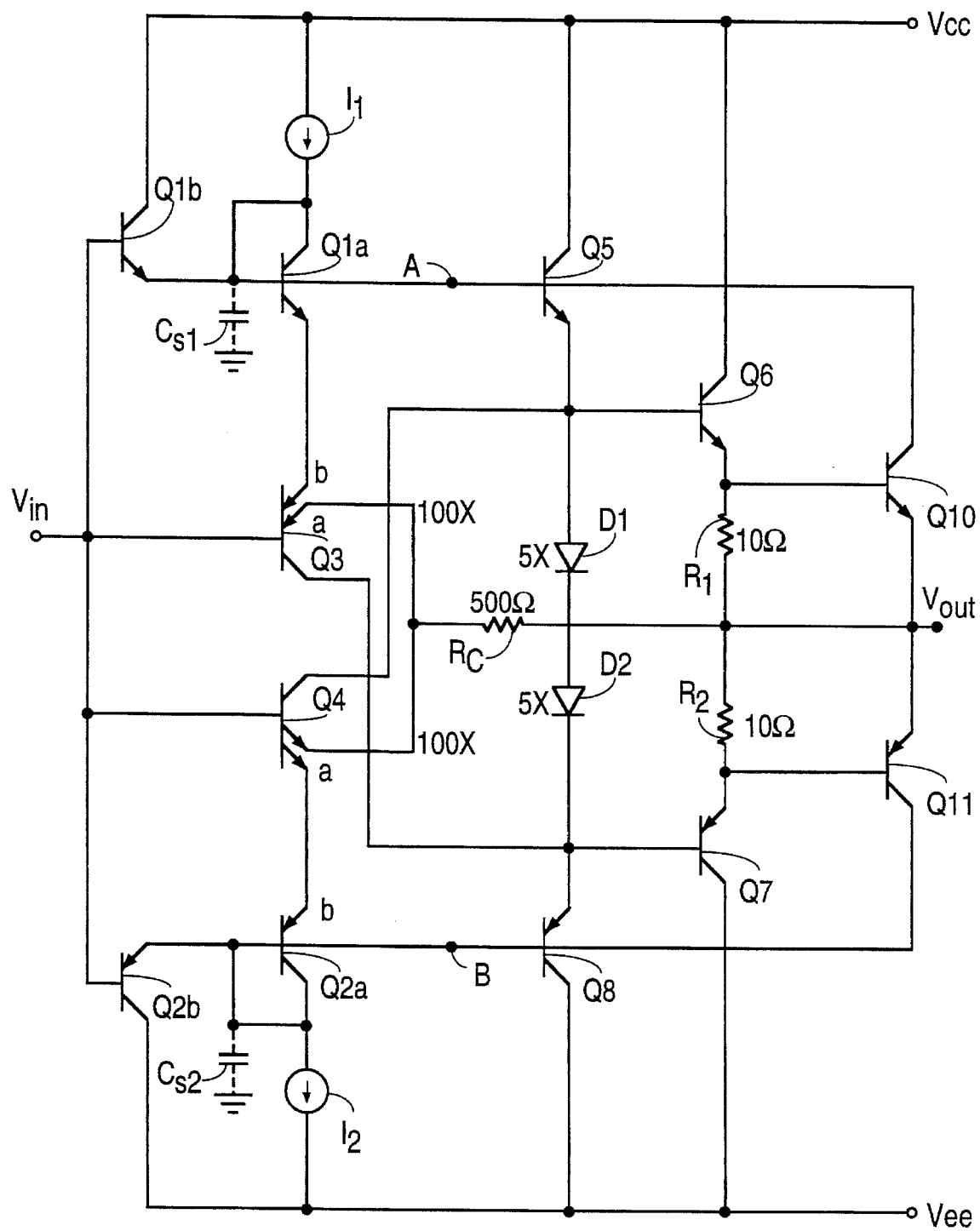
FIG. 6 shows a schematic of an amplifier output stage in a second embodiment of the present invention.

FIG. 6 shows an amplifier output stage having many elements similar to those of prior art FIG. 2. In addition, FIG. 6 includes current boosting transistors Q1b and Q2b which have their base terminals connected to the input node $V_{IN}$ and their emitters connected respectively to the base terminals of transistors Q1a, Q5, and Q2a, Q8. Thus transistors Q1b and Q2b provide extra drive (current) to overcome the parasitic capacitances $C_p$, $C_{jc}$ and $C_{je}$ associated with nodes A and B in FIG. 2, i.e. parasitic capacitances of the bases of transistors Q5 and Q8 and Q1a, Q2a, and current sources I1, I2. Thus improved response (improved slewing capability) is provided by extra current from transistors Q1b and Q2b to charge these parasitic capacitances.

Transistors Q1b and Q2b are each normally off. Thus during small signal operations i.e., in non-slewing situation, current I from current sources I1 and I2 flows through transistors Q1a and Q3b in the upper side and through transistors Q2a and Q4b in the lower side and set the total quiescent current of the chip. During a positive-going signal slew, current source I1 drives the base of transistor Q5 and its emitter current (which is β times the base current) consequently drives the base of transistor Q6 in the third buffer stage. During such a high slew signal transition condition, transistor Q1b boosts the current supplied to the bases of transistors Q1a and Q5 momentarily and thus helps charge the capacitance at node A, hence enhancing slewing performance.

Q2b similarly is normally off but provides the slew enhancement on the lower side in response to large negative input signals at $V_{IN}$. During a negative large signal transient, i.e, negative slewing, current source I2 drives the base of transistor Q8 and the emitter current of transistor Q8 (which is β times its base current) drives the base of transistor Q7. Therefore Q7 can sink larger amounts of current.

Another feature of the output stage of FIG. 6 is that each of transistors Q3 and Q4 includes a plurality (e.g. ten) of extra emitter regions. These extra emitter regions are collectively labelled Q3a and Q4a. The designation "100X" next to these extra emitter regions indicates that these extra emitter regions collectively have an area that is for example 100 times that of the minimum feature size area; in contrast, the Q3b and Q4b emitters are each 10 times the minimum feature size area. Thus these extra emitter regions have a high capacitance due to their large area. The Q3a and Q4a emitter regions are all connected together to one terminal of resistor $R_c$ to replace the capacitor $C_c$ in prior art FIG. 2, without the need to provide a capacitor per se. Thus chip area is conserved by these large emitter regions Q3a, Q4a.

Thus the large $C_{je}$ capacitances of transistors Q3a and Q4a, together with resistor $R_c$, form an RC series network that bootstraps the input to output at higher frequencies and improves the capacitive load driving capability of this output stage.

Diodes D1 and D2 each have an effective area five times (5X) that of the minimum feature size area of the other elements (i.e., the transistors). It is to be understood that diodes D1, D2 in one integrated circuit embodiment are transistors connected to operate as diodes.

Resistors R1 and R2 as shown are small value (10 ohms) resistances. In this particular case resistor $R_c$ is indicated as having 500 ohms value. It is to be understood that these values and other disclosed herein are illustrative and not limiting. The output stage as shown in FIG. 6 is a high speed high output drive output amplifier stage with a total quiescent current of 500 µA and is able to provide for example 100 mA of current to the load at terminal $V_{OUT}$.

Another feature shown in FIG. 6 not present in prior art FIG. 2 is that the collector terminals of respectively transistors Q3 and Q4 are connected to the bases of transistors Q7 and Q6 (and hence respectively also to the emitters of transistors Q8 and Q5). This bootstrapping is similar to that described above and eliminates the effect of the parasitic capacitances $C_{jc}$ of each of transistors Q3 and Q4 respective to the high impedance node $V_{in}$. Thus advantageously the basecollector parasitic capacitance of transistors Q3 and Q4 is eliminated from a signal (AC-wise) point of view. This bootstrapping operates so that relative to a DC voltage at terminal $V_{IN}$, the potential of node A is two $V_{BE}$ higher and the emitter of transistor Q5 is one $V_{BE}$ higher than the $V_{IN}$ terminal. Similarly, node B for DC purposes is at a potential two $V_{BE}$ lower than the $V_{IN}$ node and the emitter of transistor Q8 is one $V_{BE}$ lower than the input node $V_{IN}$.

Figure 1A:
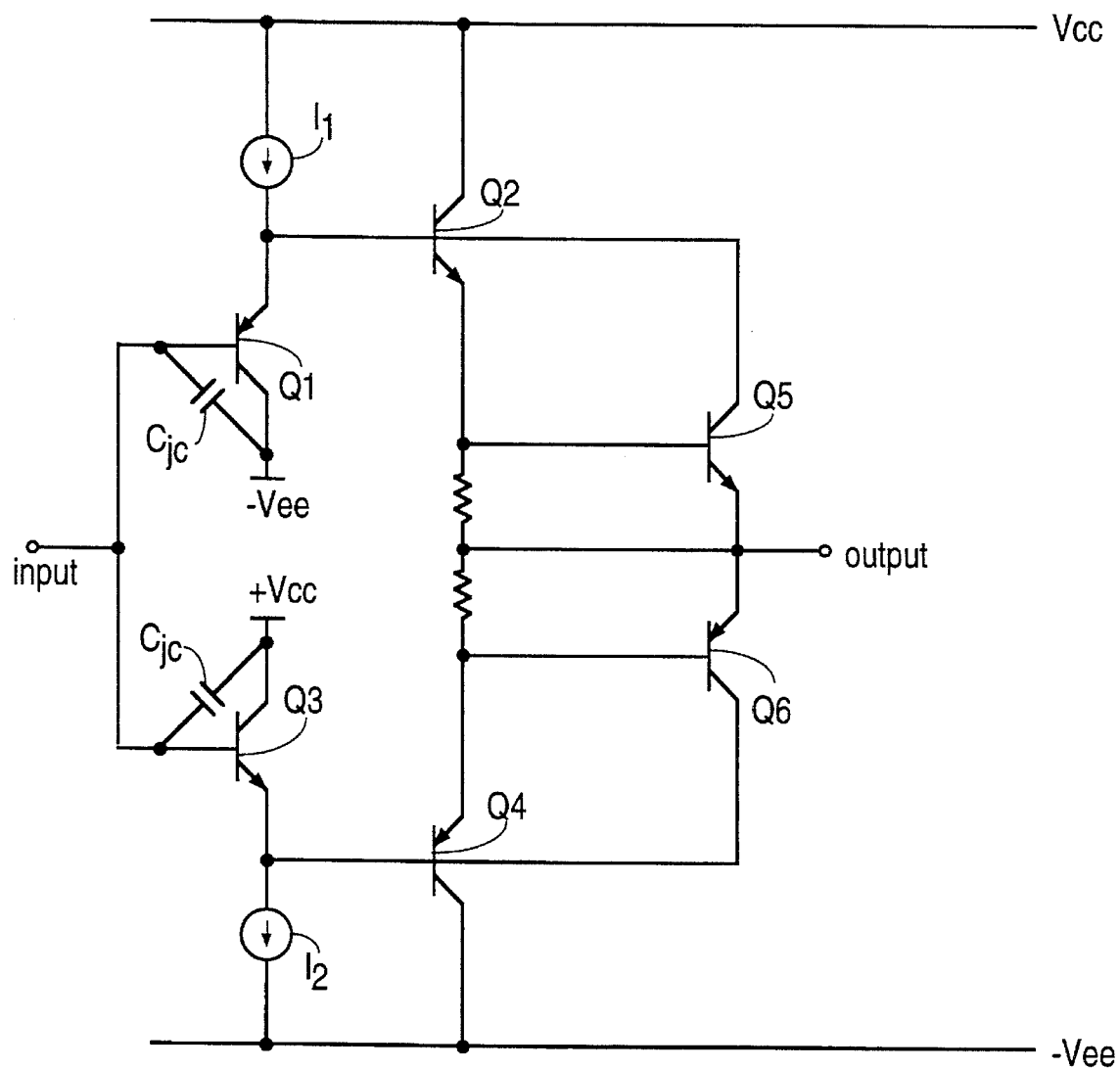
FIGS. 1(a), 1(b) show schematics of two prior art amplifier output stages.
Figure 1B:
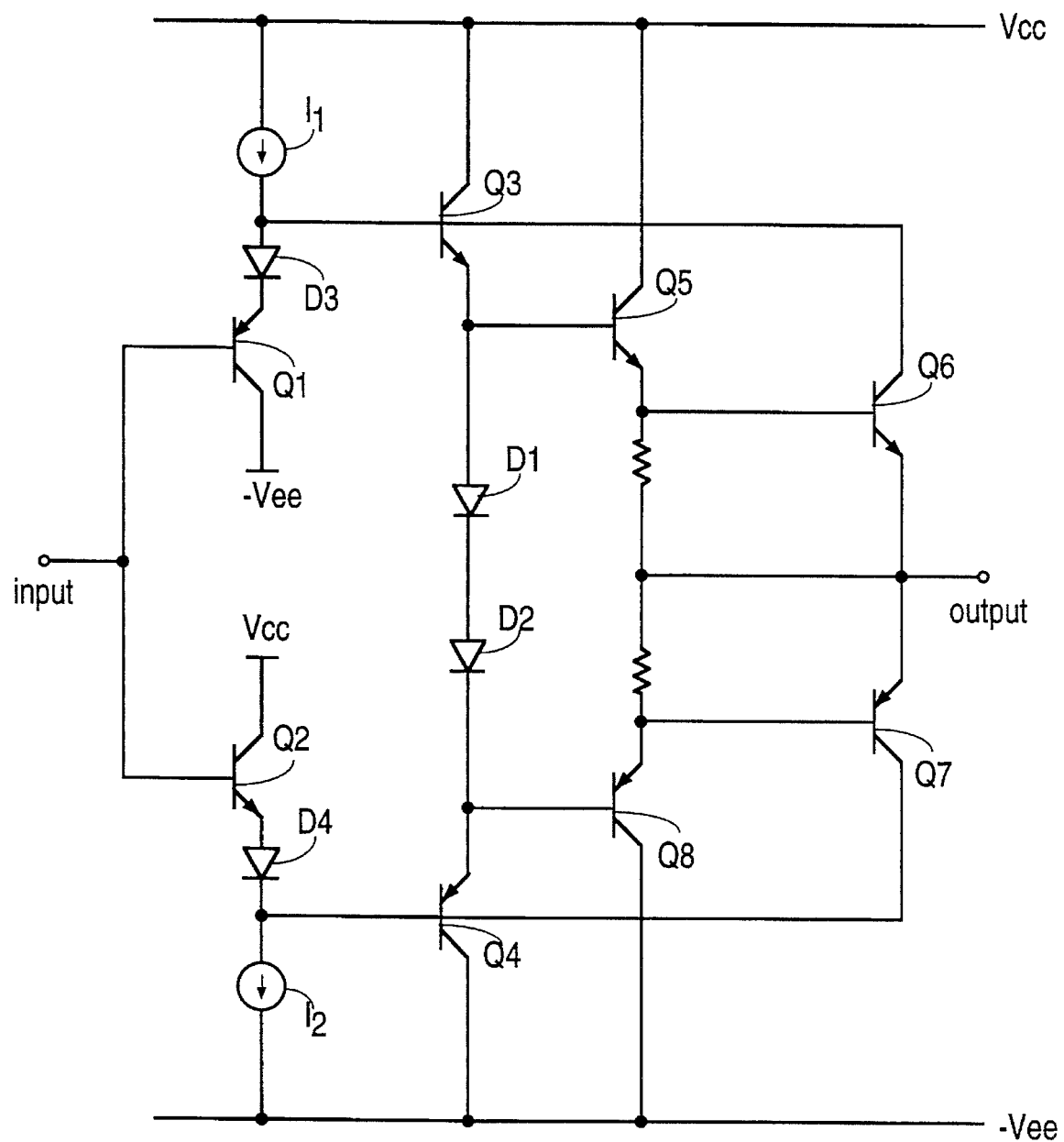

A last element shown in FIG. 6 is short circuit protection (similar to that of FIGS. 1(a) and 3) provided by transistors Q10 and Q11 both having their emitter terminals connected to the $V_{OUT}$ terminal and their base terminals connected to the emitters of respectively transistors Q6 and Q7.

An input stage suitable for use with the present output stages of FIGS. 3 and 6 is described in copending, commonly owned U.S. patent application Ser. No. 08/340,556, entitled "*Amplifier Stage Having Compensation for NPN, PNP Beta Mismatch and Slew Rate*", invented by Moraveji, filed Nov. 16, 1994, incorporated herein by reference. It is to be understood that other input stages are also compatible with the present output stage.

This description is illustrative and not limiting; further modifications will be apparent to one of ordinary skill in the art in light of this disclosure and are intended to fall within the scope of the appended claims.

I claim:

1. An output stage for an amplifier comprising:

an input node;

a first buffer stage having a first transistor and a second transistor, each of the first and second transistors having a control terminal connected to the input node;

a second buffer stage having a first transistor and a second transistor, the first transistor of the second buffer stage having a control terminal connected to a first current handling terminal of the first transistor of the first buffer stage, and the second transistor of the second buffer stage having a control terminal connected to a first current handling terminal of the second transistor of the first buffer stage;

a third buffer stage having a first transistor and a second transistor, a control terminal of the first transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage and to the control terminal of the second transistor of the third buffer stage, and a second current handling terminal of the second transistor of the first buffer stage is connected to the first current handling terminal of the second transistor of the second buffer stage and to the control terminal of the first transistor of the third buffer stage;

wherein the first transistor of each buffer stage is of a first polarity type and the second transistor of each buffer stage is of a second polarity type; and an output terminal connected to the first current handling terminal of both the first and second transistors of the third buffer stage.

2. The output stage of claim 1, further comprising a first constant current source connected to the first current handling terminal of the first transistor of the first buffer stage, and a second constant current source connected to the first current handling terminal of the second transistor of the first buffer stage.

3. An output stage for an amplifier comprising:

an input node;

a first buffer stage having a first transistor and a second transistor, each of the first and second transistors having a control terminal connected to the input node, wherein each of the first and second transistors in the first buffer stage is reverse biased;

a first current source connected to the first current handling terminal of the first transistor of the first buffer stage, and a second current source connected to the first current handlinch terminal of the second transistor of the first buffer stage;

a second buffer stage having a first transistor and a second transistor, the first transistor of the second buffer stage having a control terminal connected to a first current handling terminal of the first transistor of the first buffer stage, and the second transistor of the second buffer stage having a control terminal connected to a first current handling terminal of the second transistor of the first buffer stage;

a third buffer stage having a first transistor and a second transistor, a control terminal of the first transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage, and a second current handling terminal of the second transistor of the first buffer stage is connected to the first current handling terminal of the second transistor of the second buffer stage;

wherein the first transistor of each buffer stage is of a first polarity type and the second transistor of each buffer stage is of a second polarity type; and an output terminal connected to the first current handling terminal of both the first and second transistors of the third buffer stage.

4. An output stage for an amplifier comprising:

an input node;

a first buffer stage having a first transistor and a second transistor, each of the first and second transistors having a control terminal connected to the input node a second buffer stage having a first transistor and a second transistor, the first transistor of the second buffer stage having a control terminal connected to a first current handling terminal of the first transistor of the first buffer stage, and the second transistor of the second buffer stage having a control terminal connected to a first current handling terminal of the second transistor of the first buffer stage;

a third buffer stage having a first transistor and a second transistor, a control terminal of the first, transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage, and a second current handling terminal of the second transistor of the first buffer stage is connected to the first current handling terminal of the second transistor of the second buffer stage;

wherein the first transistor of each buffer stage is of a first polarity type and the second transistor of each buffer stage is of a second polarity type;

an output terminal connected to the first current, handling terminal of both the first and second transistors of the third buffer stage; and a series-connected resistance and capacitance connected between the input node and the output terminal.

5. The output stage of claim 1, further comprising means for damping the first buffer stage.

6. An output stage for an amplifier comprising:

an input node;

a first buffer stage having a first transistor and a second transistor, each of the first and second transistors having a control terminal connected to the input node;

a second buffer stage having a first transistor and a second transistor, the first transistor of the second buffer stage having a control terminal connected to a first current handling terminal of the first transistor of the first buffer stage, and the second transistor of the second buffer stage having a control terminal connected to a first current handling terminal of the second transistor of the first buffer stage;

a third buffer stage having a first transistor and a second transistor, a control terminal of the first transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage, and a second current handling terminal of the second transistor of the first buffer stage is connected to the first current handling terminal of the second transistor of the second buffer stage;

wherein the first transistor of each buffer stage is of a first polarity type and the second transistor of each buffer stage is of a second polarity type;

an output terminal connected to the first current handling terminal of both the first and second transistors of the third buffer stage; and means for damping the third buffer stage.

7. The output stage of claim 2, further comprising a first resistor connected between the first current source and the first current handling terminal of the first transistor of the first buffer stage, and a second resistor connected between the second current source and the first current handling terminal of the second transistor of the first buffer stage.

8. The output stage of claim 1, further comprising a shorting circuit connected to the output terminal and to the third buffer stage.

9. An output stage for an amplifier comprising:

an input node;

a first buffer stage having a first transistor and s second transistor, each of the first and second transistors having a control terminal connected to the input node;

a second buffer stage having a first transistor and s second transistor, the first transistor of the second buffer stage having a control terminal connected to a first current handling terminal of the first transistor of the first buffer stage, and the second transistor of the second buffer stage having a control terminal connected to a first current handling terminal of the second transistor of the first buffer stage;

a third buffer stage having a first transistor and a second transistor, a control terminal of the first transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage, and a second current handling terminal of the second transistor of the first buffer stage is connected to the first current handling terminal of the second transistor of the second buffer stage;

wherein the first transistor of each buffer stage is of a first polarity type and the second transistor of each buffer stage is of a second polarity type;

an output terminal connected to the first current handling terminal of both the first and second transistors of the third buffer stage; and a shorting circuit connected to the output terminal and to the third buffer stage, the shorting circuit including a first and a second transistor each having a first current handling terminal connected to the output terminal, and each having a control terminal connected respectively to the first current handling terminals of respectively the first and second transistors of the third buffer stage.

10. An output stage for an amplifier comprising:

an input node;

a first buffer stage having a first transistor and a second transistor, each of the first and second transistors having a control terminal connected to the input node;

a second buffer stage having a first transistor and a second transistor, the first transistor of the second buffer stage having a control terminal connected to a first current handling terminal of the first transistor of the first buffer stage and the second transistor of the second buffer stage having a control terminal connected to a first current handling terminal of the second transistor of the first buffer stage;

a third buffer stage having a first transistor and a second transistor, a control terminal of the first transistor being connected to a first current handling terminal of the first transistor of the second buffer stage, and a control terminal of the second transistor of the third buffer stage being connected to a first current handling terminal of the second transistor of the second buffer stage;

wherein a second current handling terminal of the first transistor of the first buffer stage is connected to the first current handling terminal of the second transistor of the second buffer stage, and a second current handling terminal of the second transistor of the first buffer stage is connected to the first current handling terminal of the second transistor of the second buffer stage;

wherein the first transistor of each buffer stage is of a first polarity type and the second transistor of each buffer stage is of a second polarity type; and wherein at least two of the transistors selected from the transistors of the first, second and third buffer stages are formed in a single N-doped well region; and an output terminal connected to the first current handling terminal of both the first and second transistors of the third buffer stage.

11. An amplifier having at least first and a second buffer stages which are connected, each buffer stage having a first and second transistor, the first transistor of each buffer stage being a PNP type and the second transistor of each buffer stage being an NPN type, wherein a collector of the first transistor in the first buffer stage is bootstrapped to an emitter of the second transistor of the second buffer stage, and a collector of the second transistor in the first buffer stage is bootstrapped to an emitter of the second transistor in the second buffer stage; and wherein each of the first and second transistors in the first buffer stage has at least one additional emitter, and each additional emitter is connected to an output terminal of the amplifier.

12. An amplifier having at least a first and a second buffer stages which are connected, each buffer stage having a first and second transistor, the first transistor of each buffer stage being a PNP type and the second transistor of each buffer stage being an NPN type, wherein a collector of the first transistor in the first buffer stage is bootstrapped to an emitter of the second transistor of the second buffer stage, and a collector of the second transistor in the first buffer stage is bootstrapped to an emitter of the second transistor in the second buffered stage; and wherein the PNP transistors each are formed in an N doped well in a single substrae, the emitter and collector of each PNP transistor being formed in the N doped well, and wherein at least one N doped well is bootstrapped by being connected to a voltage level other than that of a supply voltage.

13. The amplifier of claim 12, in which the N doped well is connected to a collector of another PNP transistor in one of the first, second, and third buffer stages.

14. The amplifier of claim 11, wherein each of the first and second transistors in the first buffer stage has a plurality of additional emitters having a collective area about ten times greater than that of a first emitter of each of the first and second emitters of each transistor in the first buffer stage, and all the additional emitters are connected to an output terminal of the amplifier.

15. The amplifier of claim 11, further comprising a first and a second current supply transistor, each having a control terminal connected to an input node of the amplifier, each having a first current handling terminal connected to a voltage supply, and each having a second current handling terminal connected to a control terminal of respectively the first and the second transistor in the second buffer stage.

16. A method for outputting a signal from an amplifier having at least two output buffer stages, each output buffer stage having a first and a second transistor, each transistor having a collector and an emitter, the first transistor in each buffer stage being of a first polarity type and the second transistor in each buffer stage being of a second polarity type, the method comprising the steps of:

bootstrapping the collectors of the first and second transistors of the first buffer stage to an input signal through the emitter of the first transistor of the first buffer stage and through the emitter of the first transistor of the second buffer stage; and bootstrapping the collectors of the first and second transistors of the first buffer stage to the input signal through the emitter of the second transistor of the first buffer stage and through the emitter of the second transistor of the second buffer stage.

17. An amplifier stage having an input buffer having a first and a second transistor and at least one buffer stage driven by the input buffer, the buffer stage having an output terminal, wherein each of the first and second transistors has a first emitter connected to the buffer stage, and each of the first and second transistors has a plurality of second emitters, each connected in parallel to the output terminal.

18. The amplifier stage of claim 17, wherein the plurality of second emitters for each transistor has a collective area about ten times that of the first emitter for each transistor.

19. The output stage of claim 2, wherein each of the first and second transistors in the first buffer stage is reverse biased.

20. The output stage of claim 1 further comprising a series-connected resistance and capacitance connected between the input node and the output terminal.

21. The output stage of claim 1, further comprising means for damping the third buffer stage.

22. The output stage of claim 1, further comprising a shorting circuit connected to the output terminal and to the third buffer stage.

23. The output stage of claim 22, the shorting circuit including a first and a second transistor each having a first current handling terminal connected to the output terminal, and each having a control terminal connected respectively to the first current handling terminals of respectively the first and second transistors of the third buffer stage.

24. The output stage of claim 1, wherein at least two of the transistors selected from the transistors of the first, second and third buffer stages are formed in a single N-doped well region.

25. The amplifier of claim 11, in which the PNP transistors each are formed in an N doped well in a single substrate, the emitter and collector of each PNP transistor being formed in the N doped well, and wherein at least one N doped well is bootstrapped by being connected to a voltage level other than that of a supply voltage.

* * * * *

UNITED STATES PATENT AND TRADEMARK OFFICE
CERTIFICATE OF CORRECTION

PATENT NO.   :   5,515,007
DATED        :   May 7, 1996
INVENTOR(S)  :   Farhood Moraveji It is certified that error appears in the above-identified patent and that said Letters Patent is hereby corrected as shown below:

Col. 10, line 43, change "s second" to --a second--.

Signed and Sealed this

Twenty-fifth Day of February, 1997

Attest:

BRUCE LEHMAN

*Attesting Officer*    *Commissioner of Patents and Trademarks*